United States Patent [19]
Lin

[11] Patent Number: 6,010,807
[45] Date of Patent: Jan. 4, 2000

[54] PHASE-SHIFTING MASK FOR PHOTOLITHOGRAPHY IN SEMICONDUCTOR FABRICATIONS

[75] Inventor: Benjamin Szu-Min Lin, Chiayi, Taiwan

[73] Assignee: United Microelectronics Corp., Hsin-Chu, Taiwan

[21] Appl. No.: 09/056,453

[22] Filed: Apr. 7, 1998

[30] Foreign Application Priority Data

Nov. 22, 1997 [TW] Taiwan ................................. 86117510

[51] Int. Cl.[7] ........................................................ G03F 9/00
[52] U.S. Cl. .................................................................. 430/5
[58] Field of Search ............................. 430/5, 311, 313, 430/322

[56] References Cited

U.S. PATENT DOCUMENTS 5,429,897  7/1995  Yoshioka et al. ............................ 430/5

Primary Examiner—S. Rosasco

[57] ABSTRACT

A phase-shifting mask (PSM) is provided for use in a photolithographic process in semiconductor fabrications. The phase-shifting mask includes a quartz plate and a plurality of mask pieces located at predefined locations over said quartz plate. Each of said mask pieces includes a semi-transparent masking layer formed on said quartz plate and a semi-transparent phase-shifting layer formed on the periphery of said semi-transparent masking layer. The phase-shifting mask has the benefits of facilitating auto generation of the mask patterns thereon through computer graphic means and increasing the resolution and contrast of the pattern definition in the photolithographic process.

7 Claims, 5 Drawing Sheets

PHASE-SHIFTING MASK FOR PHOTOLITHOGRAPHY IN SEMICONDUCTOR FABRICATIONS

CROSS-REFERENCE TO RELATED APPLICATION

This application claims the priority benefit of Taiwan application serial no. 86117510, filed Nov. 22, 1997, the full disclosure of which is incorporated herein by reference.

BACKGROUND OF THE INVENTION

1. Field of the Invention

This invention relates to semiconductor fabrication technologies, and more particularly, to a phase-shifting mask (PSM) for use in a photolithographic process in semiconductor fabrications, which can facilitate the automatic generation of the mask patterns thereon and help increase the resolution and contrast of the pattern definition.

2. Description of Related Art

In semiconductor fabrications, photolithography is an important and indispensable technique which is used to transfer circuit layout patterns through a mask onto predefined locations on an IC chip. Many processes in semiconductor fabrications, such as etching and ion implantation, require the use of photolithography. In a photolithographic process, resolution and depth of focus (DOF) are two major factors to appraise the quality of the pattern definition. A high level of integration requires a high resolution of pattern definition since the feature size is very small. To increase the resolution, a laser source with a very short wavelength, such as a krypton (Kr) deep ultra-violet laser with a wavelength of 2,480 Å (angstrom), is used as the exposure light in the photolithographic process. The use of a short-wavelength exposure light, however, will result in a shallow DOF. To allow high resolution and good DOF, a solution is to use the so-called phase-shifting mask (PSM).

Fundamentally, a phase-shifting mask is formed by adding phase shifter layers on a conventional mask that can cause interference to the light passing therethrough such that the resolution of the resultant pattern definition can be increased. One benefit of the phase-shifting mask is that it can increase the resolution of pattern definition without changing the wavelength of the exposure light.

In semiconductor fabrications, line-shaped elements, such as word lines, bit lines, and metal interconnects in a DRAM device, are defined by forming a line pattern on a mask. Positive photoresist is customarily used in the photolithographic process. In sub-micron or higher level of integrations where line width is extremely small, the alternating PSM is customarily used for the photolithographic process. A conventional type of alternating PSM is depicted in detail in the following with reference to FIGS. 1A–1C, wherein FIG. 1A is a schematic top view of the conventional alternating PSM; FIG. 1B is a schematic sectional view of the alternating PSM of FIG. 1 A cutting through the line I—I; and FIG. 1C is a graph, showing the distribution of the illumination over the wafer caused by the exposure light passing through the alternating PSM of FIG. 1A.

As shown in FIGS. 1A–1B, the conventional alternating PSM includes a quartz plate 16 and a plurality of opaque mask patterns 10 (which can be films of chromium) and shifter layers 12 (which can be films of the compound $MoSi_zO_xN_y$). The exposure light can pass through both the shifter layers 12 and the unmasked areas, as designated by the reference numeral 14, in the mask. The light passing through the unmasked areas 14 will not be shifted in phase, while the light passing through the shifter layers 12 will be shifted in phase by 180°. FIG. 1C shows the distribution of illumination over the wafer caused by the light passing through the alternating PSM of FIG. 1A. Since the shifter layers 12 are arranged beside the opaque mask patterns 10 in an alternating manner over the phase-shifting mask, the diffractions of the light passing therethrough can be canceled out, thereby resulting in a zero-intensity point that can help increase the resolution of pattern definition on the wafer.

In the foregoing alternating PSM, the layout of the opaque mask patterns 10 and the shifter layers 12 can be generated automatically through computer graphic means. However, if the mask contains irregular or nonlinear patterns, they are not auto generatable through the computer graphic means. For example, in the case of FIG. 1A, the portion indicated by the reference numeral 18, due to its irregularly arranged manner, can not be recognized by the computer for automatic pattern generation.

SUMMARY OF THE INVENTION

It is therefore an objective of the present invention to provide a phase-shifting mask whose mask patterns, whether line or irregular patterns, can be generated automatically through computer graphic means.

It is another objective of the present invention to provide a phase-shifting mask whose mask patterns are formed by forming semi-transparent phase-shifting layers on the periphery of semi-transparent masking layers, which can help increase the resolution of the pattern definition of the photolithographic process. In accordance with the foregoing and other objectives of the present invention, a new phase-shifting mask for pattern transfer in semiconductor fabrication processes is provided. The phase-shifting mask of the invention includes a quartz plate, and a plurality of mask pieces formed at predefined locations over the quartz plate. Each of the mask pieces includes a semi-transparent masking layer formed along the centerline of each mask piece, and a semi-transparent phase-shifting layer formed on the periphery of said semi-transparent masking layer. The semi-transparent masking layer 22 of each mask piece 28 is not adjacent to that of any neighboring mask pieces.

The semi-transparent masking layer has a light transmittance coefficient of from 4% to 8%, and is capable of causing a phase shift of 0° to the light passing therethrough; while the semi-transparent phase-shifting layer has a light transmittance coefficient of from 4% to 8%, and is capable of causing a phase shift of 180° to the light passing therethrough.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
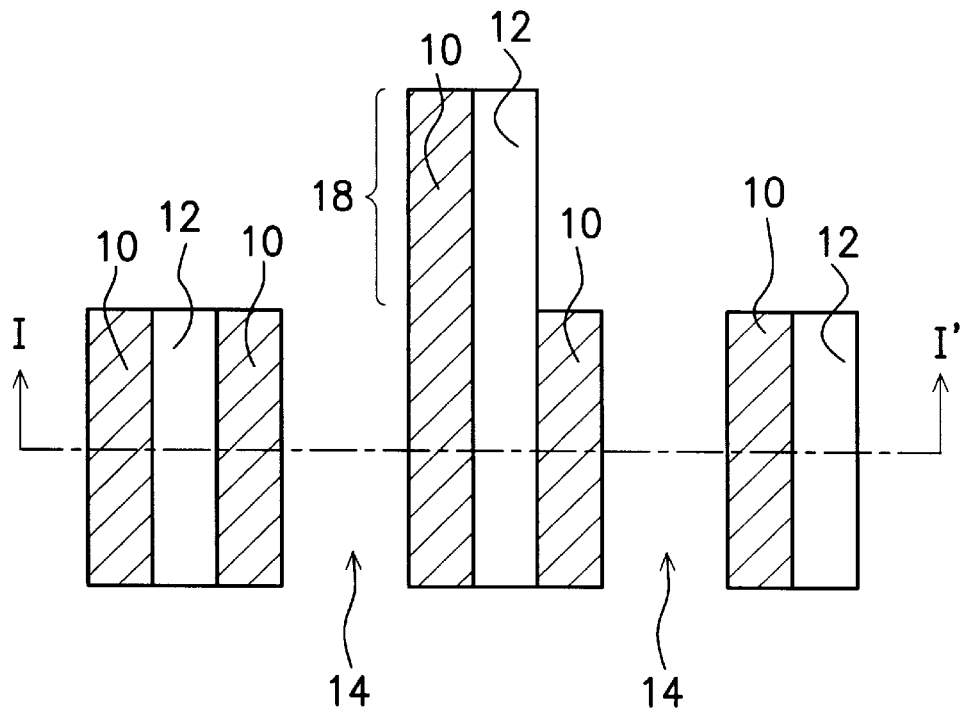
FIG. 1A is a schematic top view of a conventional alternating phase-shifting mask.
Figure 1B:
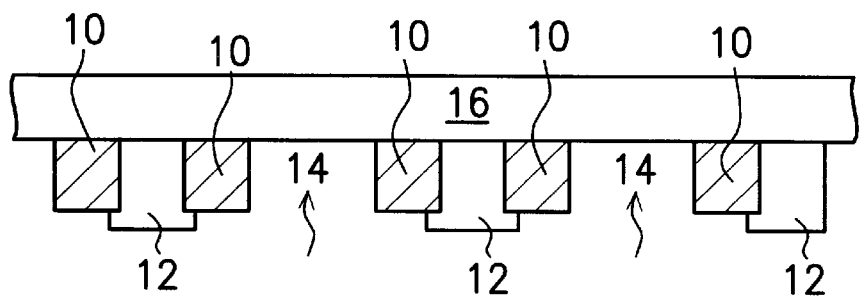
FIG. 1B is a schematic diagram showing the cross sectional view of the alternating phase-shifting mask of FIG. 1A viewed from the plane I—I.
Figure 1C:
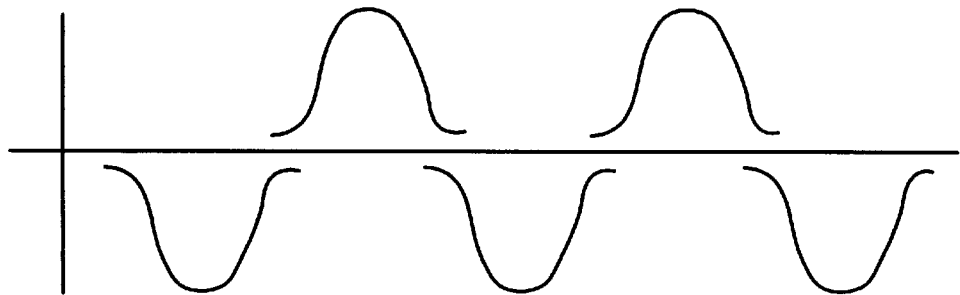
FIG. 1C is a graph, showing the distribution of illumination over the wafer caused by the light passing through the alternating phase-shifting mask of FIG. 1A.
Figure 2A:
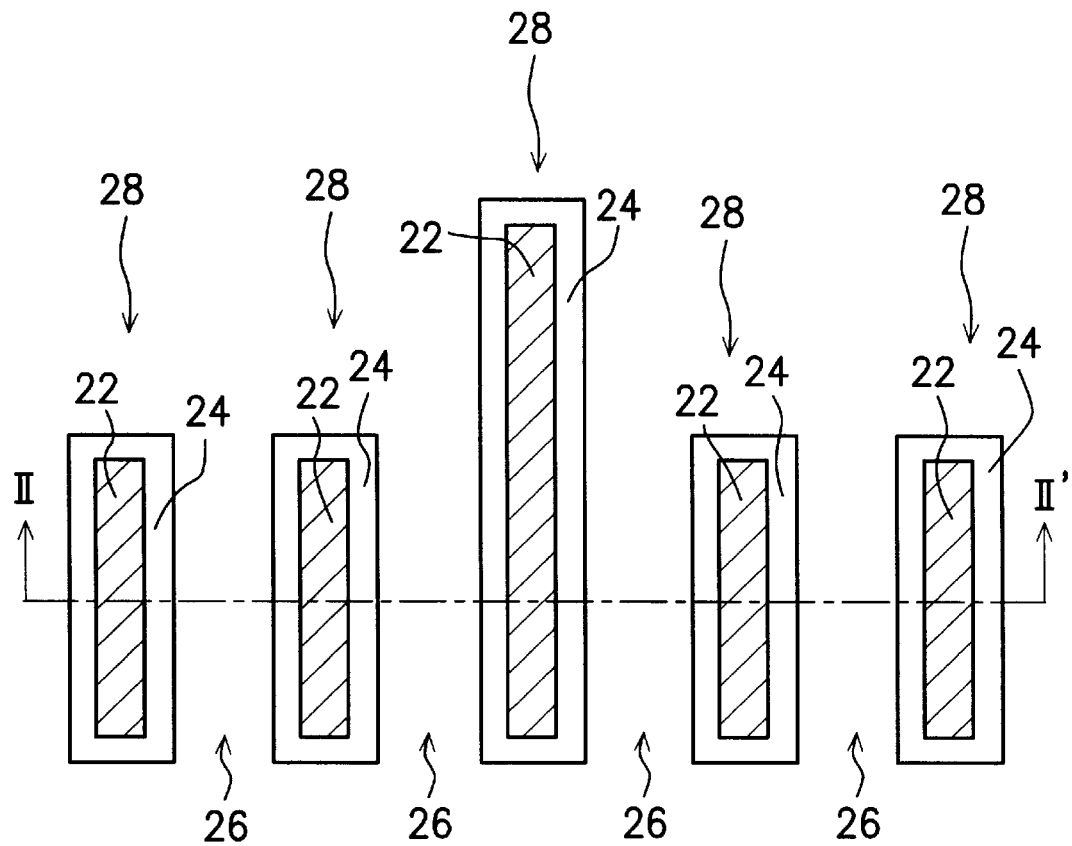
FIG. 2A is a schematic diagram showing the top view of the phase-shifting mask according to the invention.
Figure 2B:
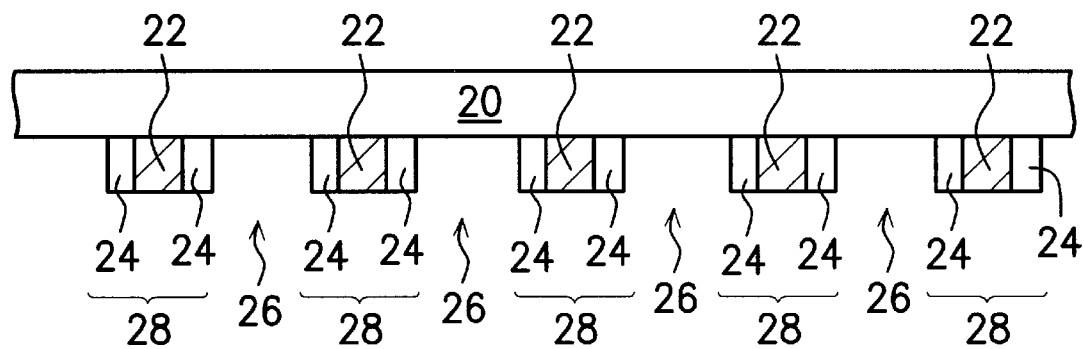
FIG. 2B is a schematic diagram showing the cross sectional view of the phase-shifting mask of FIG. 2A viewed from the plane II—II.
Figure 2C:
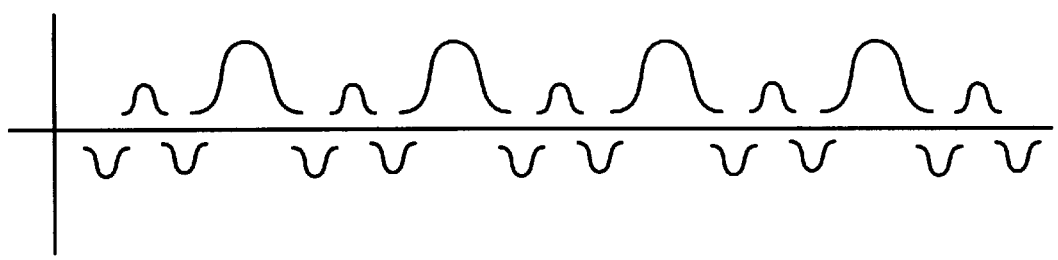
FIG. 2C is a graph, showing the distribution of illumination over the wafer caused by the light passing through the phase-shifting mask of FIG. 2A.

A preferred embodiment of the phase-shifting mask according to the invention is disclosed in the following with reference to FIGS. 2A–2C, wherein FIG. 2A is a schematic top view of the phase-shifting mask of the invention; FIG. 2B is a schematic sectional view of the phase-shifting mask of FIG. 2A cutting through the line II—II; FIG. 2C is a graph, showing the distribution of illumination over the wafer caused by the light passing through the phase-shifting mask of FIG. 2B.

Referring first to FIGS. 2A and 2B, the phase-shifting mask of the invention includes a transparent plate, such as a quartz plate 20, and a plurality of mask pieces 28 formed with predefined shape and size at predefined locations over the quartz plate 20. These mask pieces 28 are used to define a plurality of integrated circuit elements, such as word lines, bit lines, or metal interconnects, on the IC chips during a photolithographic process. Each of the mask pieces 28 includes two parts: a semi-transparent masking layer 22 and a semi-transparent phase-shifting layer 24 formed on the periphery of the semitransparent masking layer 22.

In accordance with the invention, both the semi-transparent masking layer 22 and the semi-transparent phase-shifting layer 24 have a light transmittance coefficient of from 4% to 8%, while the uncovered areas in the quartz plate 20, designated by the reference numeral 26, have a light transmittance coefficient of nearly 100%. In terms of phase-shifting capability, the uncovered transparent areas 26 in the quartz plate 20 can cause a phase shift of 0° to the light passing therethrough, the semi-transparent phase-shifting layer 24 can cause a phase shift of 180° to the light passing therethrough; and the semi-transparent masking layer 22 can cause a phase shift of 0° to the light passing therethrough. FIG. 2C is a graph showing the distribution of illumination over the wafer caused by the light passing through the phase-shifting mask of FIG. 2B.

Fundamentally, the mask pieces 28 are defined at those locations where the lightsensitive emulsion (photoresist) on the wafer is to be unexposed to the exposure light. The purpose of the semi-transparent phase-shifting layer 24 is to cause a phase shift of 180° to the light passing through the edges of mask pieces 28 so as to cancel out the diffraction effect occurring at these edges to produce a narrow zero-intensity line along the edge of the semi-transparent masking layer 22 that can help increase the resolution and contrast of the pattern definition of the phase-shifting mask. The light transmittance coefficient of the semitransparent phase-shifting layer 24 is preferably from 4% to 8%. A higher light transmittance coefficient above this range can affect the masking effect in an undesirable manner. The semi-transparent masking layer 22 is used to provide the desired masking effect. The semi-transparent phase-shifting layer 24 is substantially equal in light transmittance coefficient to the semi-transparent masking layer 22, but differs in phase shifting capability. As a result of this provision in accordance with the invention, the diffractions at the border between the semi-transparent masking layer 22 and the semi-transparent phase-shifting layer 24 can be substantially canceled out, thus resulting in the occurrence of a narrow zero-intensity line along the edge of the semi-transparent masking layer 22 that can help increase the masking effect by the mask pieces 28.

Figure 3:
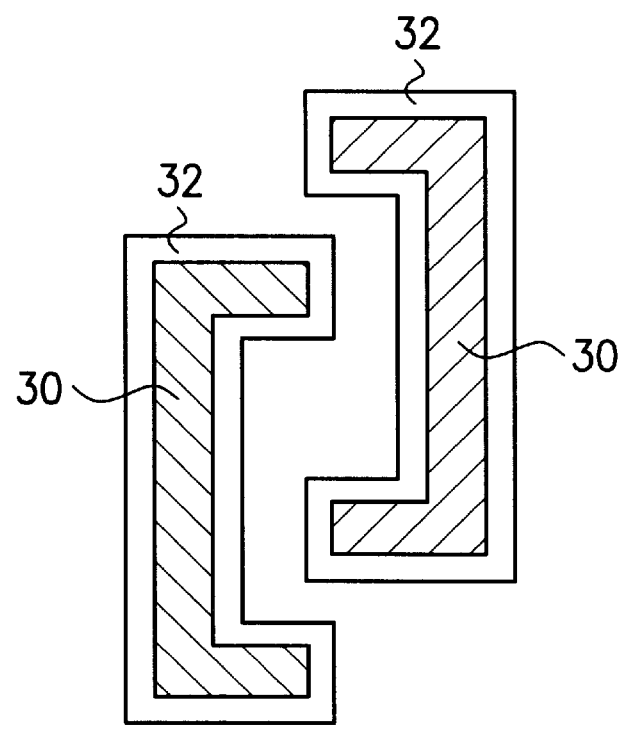
FIG. 3 is a schematic diagram of a mask pattern incorporated in the phase-shifting mask of the invention.

In the phase-shifting mask of FIGS. 2A–2B, the mask pieces are formed in simple line shapes, which can be more easily generated through computer graphic means than the prior art since the invention involves no complex computations for the alternating layout in the prior art. FIG. 3 shows two U-shaped nonlinear patterns, each also including a semi-transparent masking layer 30 and a semi-transparent phase-shifting layer 32 formed on the periphery of the semi-transparent masking layer 22. As shown, the semi-transparent layer 30 can be easily generated through computer graphic means, and the semi-transparent phase-shifting layer 32 can also be easily generated by plotting along the periphery of the semi-transparent layer 30. The easy generation of the semi-transparent layer 30 and semi-transparent phase-shifting layer 32 is not achievable when using the prior art.

Fundamentally, the invention provides a phase-shifting mask which includes a semi-transparent masking layer and a semi-transparent phase-shifting layer formed on the periphery of the semi-transparent masking layer, both of which have a light transmittance coefficient of from 4% to 8%, but differ in that the semi-transparent masking layer can cause a phase shift of 0° to the light passing therethrough, and the semi-transparent phase-shifting layer can cause a phase shift of 180° to the light passing therethrough.

Figure 4A:
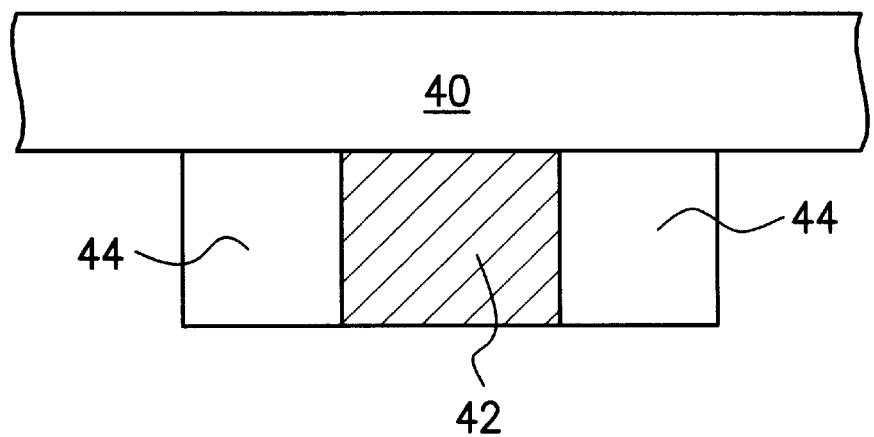
FIGS. 4A–4C are schematic diagrams used to depict various embodiments of the forming of the mask patterns on the phase-shifting mask of the invention.

FIG. 4A shows an enlarged view of a cross-sectional part of the phase-shifting mask of the invention. The quartz plate is here designated by the reference numeral 40; the semi-transparent masking layer is here designated by the reference numeral 42; and the semi-transparent phase-shifting layer is here designated by the reference numeral 44. The semi-transparent masking layer 42 and the semi-transparent phase-shifting layer 44 both have a light transmittance coefficient of from 4% to 8%, but can be made from different materials that allow the semi-transparent masking layer 42 to cause a phase shift of 0° to the light passing therethrough and the semi-transparent phase-shifting layer 44 to cause a phase shift of 180° to the light passing therethrough. In the case of FIG. 4A, for example, the semi-transparent masking layer 42 is made from a first material, and the semi-transparent phase-shifting layer 44 is made from a second material.

Alternatively, the semi-transparent masking layer 42 and the semi-transparent phase-shifting layer 44 can be made from the same material. In principle, the light transmittance coefficient and the phase shift angle of a semi-transparent layer is related to its thickness. Therefore, the material is formed into a first layer with a first thickness to serve as the semi-transparent masking layer and a second layer with a second thickness to serve as the semi-transparent phase-shifting layer.

Figure 4B:
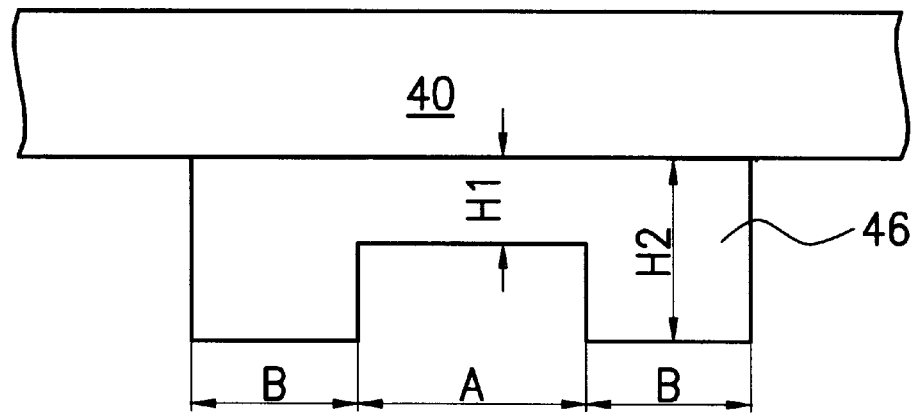

One example of this is shown in FIG. 4B, which shows the forming of a mask pattern 46 on the quartz plate 40. The mask pattern 46 is formed from the same semi-transparent material into two distinct areas A and B, with the area A having a thickness H1 and the area B having a thickness H2. The area A serves as the semi-transparent masking layer, while the area B serves as the semi-transparent phase-shifting layer. The thickness H1 can be controlled to a level that allows the area A (i.e., the semi-transparent masking layer) to have a light transmittance coefficient of from 4% to 8% and is capable of causing a phase shift of 0° to the light passing therethrough; and similarly, the thickness H2 can be controlled to a level that allows the area B (i.e., the semi-transparent phase-shifting layer 24) to have a light transmittance coefficient of from 4% to 8% and is capable of causing a phase shift of 180° to the light passing therethrough.

Figure 4C:
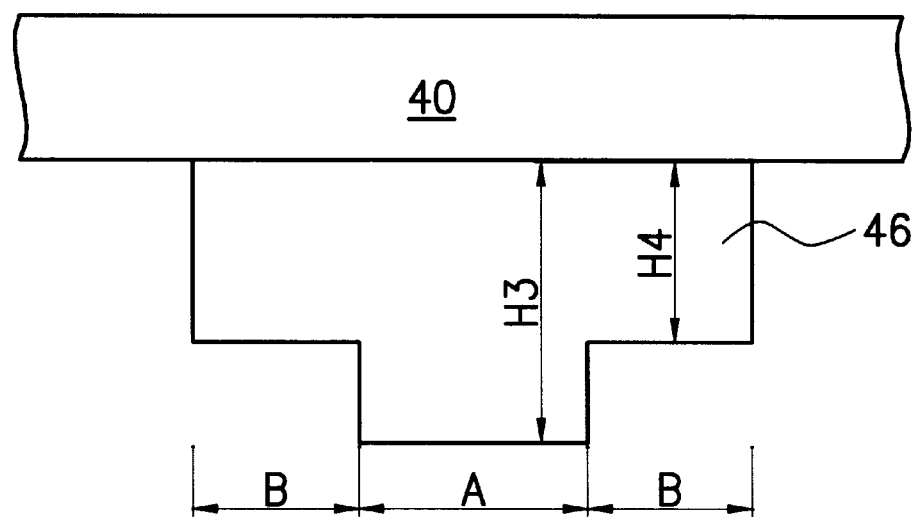

Depending on the particular semi-transparent material being used to form the semi-transparent masking layer and the semi-transparent phase-shifting layer, the mask pattern 46 in FIG. 4B can be formed in a different manner as illustrated in FIG. 4C. In the case of FIG. 4B, the height of the area A (i.e., H1) is smaller than the height of the area B (i.e., H2). However, as illustrated in FIG. 4C, if a different semi-transparent material is used, the height of the area A (here denoted by H3) can be greater than the height of the area B (here denoted by H4).

Figure 5A:
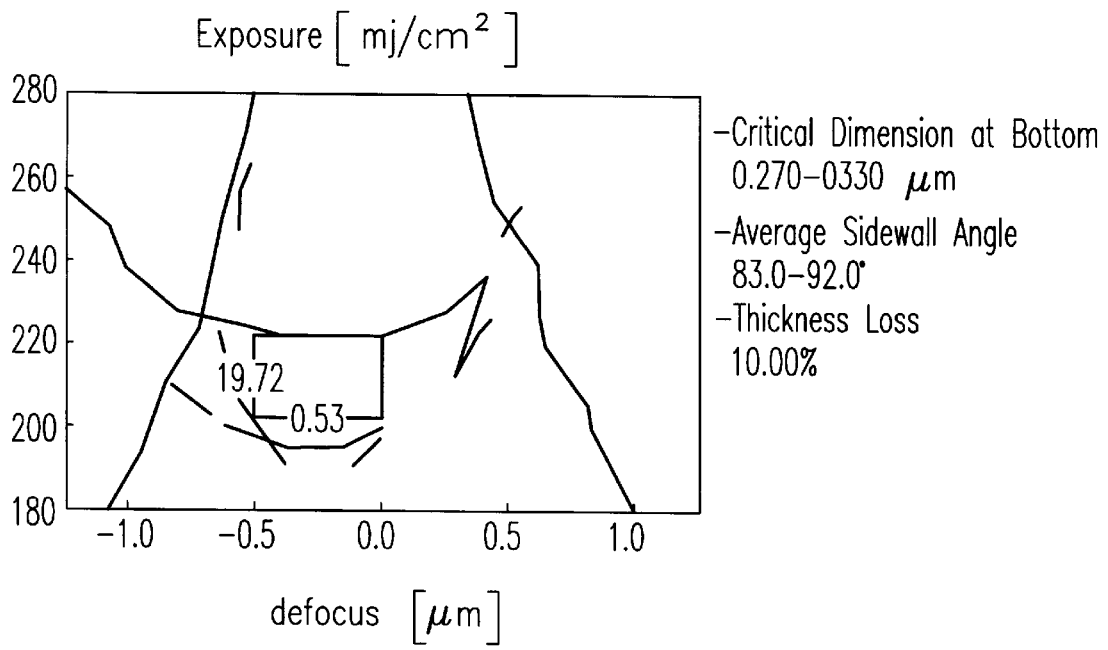
FIGS. 5A–5B are graphs used to show the advantages of the invention over the prior art.
Figure 5B:
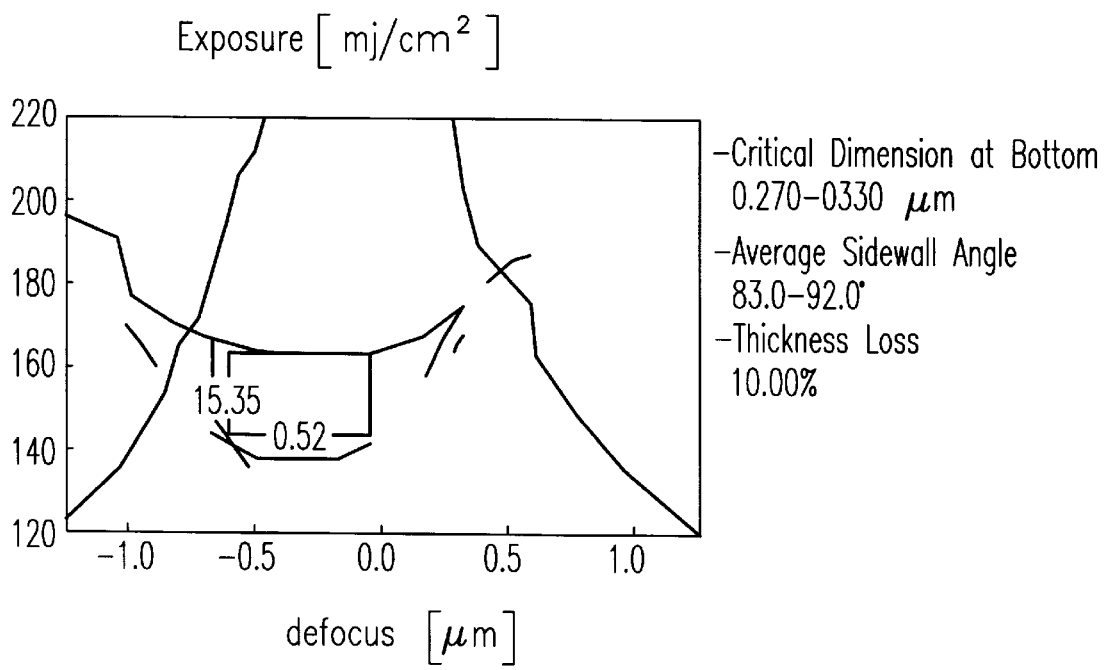

A comparison of the invention with the prior art is shown in FIGS. 5A–5B. In this comparison, the critical dimension at bottom is set at 0.270 μm to 0.330 μm; the average sidewall angel is set at 83° to 92°; and the thickness loss is set at 10% for both the phase-shifting mask of the invention and the conventional one. As shown in FIG. 5A, for the phase-shifting mask of the invention, the tolerance in defocus is about 0.53 μm and the tolerance in exposure is about 19.72 mJ/cm$^2$. By contrast, as shown in FIG. 5B, for the prior art, the tolerance in defocus is about 0.52 μm and the tolerance in exposure is about 15.35 mJ/cm$^2$. It is apparent that the invention is more advantageous than the prior art.

In conclusion, the phase-shifting mask of the invention includes mask pieces that are formed by adding semitransparent phase-shifting layers on the periphery of the semi-transparent masking layers, both of which have a light transmittance coefficient of from 4% to 8%, but differ in that the semi-transparent masking layer can cause a phase shift of 0° to the light passing therethrough, and the semi-transparent phase-shifting layer can cause a phase shift of 180° to the light passing therethrough. This allows the cancellation of the diffraction effect on the edge of the mask patterns such that the resolution and contrast of the pattern definition can be increased. Mioreover, the semi-transparent masking layers and the semi-transparent phase-shifting layers can be automatically generated through computer graphic means.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A phase-shifting mask having a line pattern to form lines which are, for example, straight, angled, or curved, comprising:
    a quartz plate; and
    a plurality of mask pieces located at predefined locations over said quartz plate to form the line pattern, each of said mask pieces including:
        a semi-transparent masking layer formed along the centerline of the mask piece, so a margin of the mask piece remains exposed on the periphery of the semi-transparent masking layer; and
        a semi-transparent phase-shifting layer formed on the periphery of said semi-transparent masking layer.

2. The phase-shifting mask of claim 1, wherein said semi-transparent masking layer has a light transmittance coefficient of from 4% to 8%.

3. The phase-shifting mask of claim 1, wherein said semitransparent phase-shifting layer has a light transmittance coefficient of from 4% to 8%.

4. The phase-shifting mask of claim 1, wherein said semi-transparent masking layer is capable of causing a phase shift of 0° to the light passing therethrough.

5. The phase-shifting mask of claim 1, wherein said semi-transparent phase-shifting layer is capable of causing a phase shift of 180° to the light passing therethrough.

6. The phase-shifting mask of claim 1, wherein each of said semi-transparent masking layers and the associated one of said semi-transparent phase-shifting layers are formed from a material which is formed into a layer with a first thickness to serve as the semi-transparent masking layer and a second thickness to serve as the semi-transparent phase-shifting layer.

7. The phase-shifting mask of claim 1, wherein said semi-transparent masking layer and said semi-transparent phase-shifting layer are formed from two different semi-transparent materials.

* * * * *